US009905901B1

(12) United States Patent
Lyu et al.

(10) Patent No.: US 9,905,901 B1
(45) Date of Patent: Feb. 27, 2018

(54) MINIATURE DIRECTIONAL COUPLING DEVICE

(71) Applicant: Advanced Ceramic X Corporation, Hsinchu Hsien (TW)

(72) Inventors: Jhin-Ying Lyu, Nantou County (TW); Wei-Jen Lee, Hsinchu County (TW); Jyh-Wen Sheen, Hsinchu County (TW)

(73) Assignee: ADVANCED CERAMIC X CORPORATION (TW)

( * ) Notice: Subject to any disclaimer, the term of this patent is extended or adjusted under 35 U.S.C. 154(b) by 65 days.

(21) Appl. No.: 15/252,212

(22) Filed: Aug. 31, 2016

(51) Int. Cl.
*H01P 5/18* (2006.01)
*H01P 1/18* (2006.01)
*H03H 7/38* (2006.01)

(52) U.S. Cl.
CPC ................ *H01P 5/18* (2013.01); *H01P 1/182* (2013.01)

(58) Field of Classification Search
CPC .................................... H01P 5/18; H03H 7/48
USPC .................................................. 333/109–112
See application file for complete search history.

(56) References Cited

U.S. PATENT DOCUMENTS 7,042,309 B2 * 5/2006 Podell ..................... H01P 5/187 333/112
8,502,620 B2 * 8/2013 Lu ........................... H01F 21/12 333/246
9,077,061 B2 * 7/2015 Tamaru .................. H01P 5/184
9,391,354 B2 * 7/2016 Ootsuka .................. H01P 5/185

* cited by examiner

*Primary Examiner* — Dean Takaoka

(57) ABSTRACT

Differing from conventional directional coupling device being implemented on a coin-like planar board, the present invention stacks a bottom substrate, at least one phase retarding unit, at least one reference ground unit, a coupled circuit layer, a main circuit layer, and a top substrate to form a miniature directional coupling device. Because this miniature directional coupling device not occupies too much circuit area when being applied in a mobile communication product, the miniature directional coupling device can meet the requirements of light weight and compact size demanded by high-technology mobile communications for the electronic components. It is worth explaining that, since the said phase retarding unit consists of many end-to-end connected transmission wires, engineers skilled in designing microwave circuit are able to carry out the modulation of coupling flatness of the miniature directional coupling device by changing a total length of the end-to-end connected transmission wires.

27 Claims, 18 Drawing Sheets

MINIATURE DIRECTIONAL COUPLING DEVICE

BACKGROUND OF THE INVENTION

1. Field of the Invention

The present invention relates to the technology field of radio frequency (RF) electronic components, and more particularly to a miniature directional coupling device applied in high-frequency communication.

2. Description of the Prior Art

Directional coupler is one kind of well-known RF electronic component, which is a passive device used in radio technology. Please refer to FIG. 1, which illustrates a stereo view of a traditional directional coupler. Moreover, please simultaneously refer to FIG. 2, where an equivalent circuit diagram of the traditional directional coupler is provided. As FIG. 1 and FIG. 2 show, the traditional directional coupler 1*a* comprises: a substrate 11*a*, a main line 12*a* formed on the substrate 11*a* and a coupled lines formed on the substrate 11*a*. In the directional coupler 1*a*, the two terminals of the main line 12*a* are respectively defined as an input terminal 121*a* and an output terminal 122*a*. Opposite to the main line 12*a*, two terminals of the coupled line 13*a* are defined as a coupled terminal 131*a* and an isolated terminal 132*a*.

After the input terminal 121*a* receives a RF signal, a portion of the electromagnetic power of the RF signal transmitted in the main line 12*a* would be coupled to the coupled line 13*a*, and then be outputted to next-stage circuit via the coupled terminal 131*a*. As engineers skilled in microwave engineering know, the coupling of the directional coupler 1*a* would achieve a maximum value in a specific bandwidth when the main line 12*a* and the coupled lines' 13*a* electrical lengths are designed as one-quarter of the wavelength of the RF signal. However, with the constant increase of the bandwidth utilized in mobile communications, the traditional directional coupler 1*a* is getting to reveal its shortcoming on insufficient coupling flatness. Please refer to FIG. 3, which shows a plotted curve of frequency versus coupling. The frequency and coupling data are integrated in following Table (1) according to the plotted curve of FIG. 3. Thus, from Table (1), the engineers skilled in microwave engineering can find there has 10 dB difference between the maximum coupling and the minimum coupling of the traditional directional coupler 1*a*. Such data result means that the traditional directional coupler 1*a* cannot meet the signal transmission requirement of the RF signal transmitted in bandwidth of 700-2700 MHz.

TABLE 1

| Frequency (MHz) | Coupling (dB) |
|---|---|
| 500 | −35 |
| 1000 | −29 |
| 1500 | −26 |
| 2000 | −24 |
| 2500 | −22 |
| 3000 | −20 |

On the other hand, despite the traditional directional coupler 1*a* can be implanted on a planar board having a coin-like size, the traditional directional coupler 1*a* still cannot satisfied with the demands of light weight and small volume made by high-technology mobile communications due to large board occupation area.

In view of the traditional directional coupler 1*a* show many drawbacks and shortcomings in practical application, inventors of the present application have made great efforts to make inventive research thereon and eventually provided a miniature directional coupling device.

SUMMARY OF THE INVENTION

The primary objective of the present invention is to provide a miniature directional coupling device. Differing from conventional directional coupling device being implemented on a coin-like planar board, the present invention stacks a bottom substrate, at least one phase retarding unit, at least one reference ground unit, a coupled circuit layer, a main circuit layer, and a top substrate to form a miniature directional coupling device. Because this miniature directional coupling device not occupies too much circuit area when being applied in a mobile communication product, the miniature directional coupling device can meet the requirements of light weight and compact size demanded by high-technology mobile communications for the electronic components. It is worth explaining that, since the said phase retarding unit consists of many end-to-end connected transmission wires, engineers skilled in designing microwave circuit are able to carry out the modulation of coupling flatness of the miniature directional coupling device by changing a total length of the end-to-end connected transmission wires.

In order to achieve the second objective of the present invention, the inventor of the present invention provides a first generic embodiment for the miniature directional coupling device, comprising:

a main body, comprising

- a first directional coupler, comprising a first main line, a first coupled line, an input port, and a coupled port;
- a second directional coupler, comprising a second main line connected to the first main line, a second coupled line, an output port, and an isolated port; and
- at least one phase retarder, being connected between the second coupled line and the first coupled line;

an input electrode, being formed on a first side of the main body, and electrically connected to the input port;

a first ground electrode, being formed on the first side of the main body;

an output electrode, being formed on the first side of the main body, and electrically connected to the output port;

an isolated electrode, being formed on a second side of the main body, and electrically connected to the isolated port; wherein the second side is opposite and parallel to the first side;

a second ground electrode, being formed on the second side of the main body; and a coupled electrode, being formed on the second side of the main body, and electrically connected to the coupled port.

Moreover, for achieving the second objective of the present invention, the inventor of the present invention provides a second generic embodiment for the miniature directional coupling device, comprising:

a main body, comprising

- N number of directional couplers, wherein each of the directional couplers are connected to each other and comprise a main line and a coupled line; moreover, a first directional coupler of the N number of directional couplers having an input port and a coupled port, and a N-th directional coupler of the N number of directional couplers having an output port and an isolated port; and N−1 number of phase retarders, wherein each of the phase retarders are connected between two adjacent directional couplers for making one main line of one of the two adjacent directional couplers electrically connected to the other one main line of the other directional coupler;

an input electrode, being formed on a first side of the main body, and electrically connected to the input port;

a first ground electrode, being formed on the first side of the main body;

an output electrode, being formed on the first side of the main body, and electrically connected to the output port;

an isolated electrode, being formed on a second side of the main body, and electrically connected to the isolated port; wherein the second side is opposite and parallel to the first side;

a second ground electrode, being formed on the second side of the main body;

a coupled electrode, being formed on the second side of the main body, and electrically connected to the coupled port.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a miniature directional coupling device according to the present invention, embodiments of the present invention will be described in detail with reference to the attached drawings hereinafter.

First Embodiment

Figure 4:
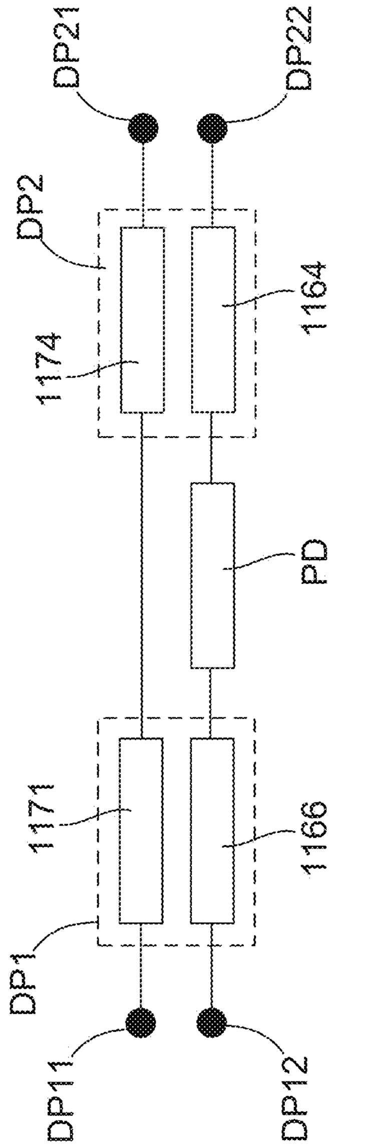
FIG. 4 shows an equivalent circuit diagram of a first embodiment of a miniature directional coupling device according to the present invention.

With reference to FIG. 4, which illustrates an equivalent circuit diagram of a first embodiment of a miniature directional coupling device according to the present invention. Moreover, please simultaneously refer to FIG. 5A, FIG. 5B and FIG. 5C, where stereo diagrams of the first embodiment of the miniature directional coupling device are provided. As the related drawings show, the miniature directional coupling device 1 proposed by the present invention comprises: a main body 11, an input electrode 12, a first ground electrode 13, an output electrode 14, an isolated electrode 15, a second ground electrode 16, and a coupled electrode 17.

From FIG. 4, it can know that the main body 11 is provided with a first directional coupler DP1, a second directional coupler DP2 and at least one phase retarder PD in the internal thereof, wherein the first directional coupler DP1 comprises a first main line 1171 and a coupled line 1166, and has an input port DP11 and a coupled port DP12. Moreover, the second directional coupler DP2 comprises a second main line 1174 and a second coupled line 1164, and has an output port DP21 and an isolated port DP22. In the present invention's design, the first main line 1171 is connected to the second main line 1174, and the first coupled line 1166 is electrically connected to the second coupled line 1164 through the phase retarder PD.

Figure 5A:
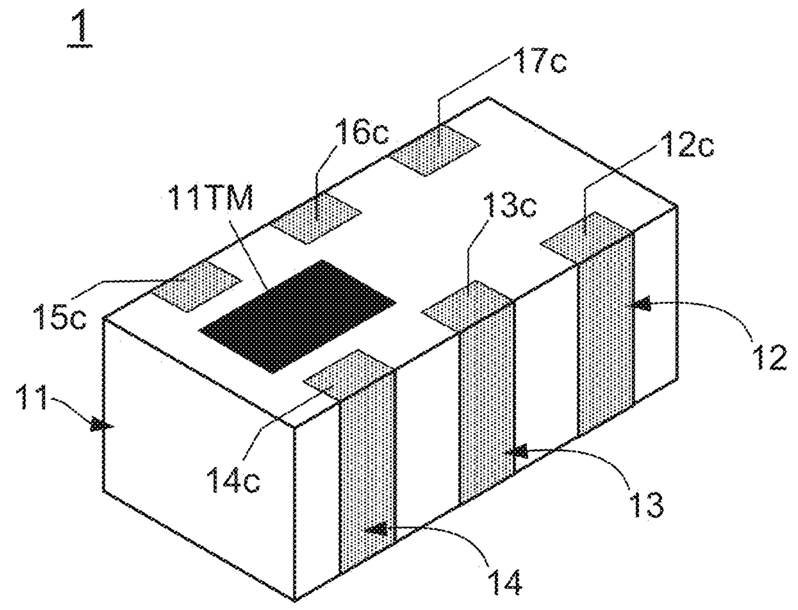
FIG. 5A, FIG. 5B and FIG. 5C show stereo diagrams of the first embodiment of the miniature directional coupling device.
Figure 5B:
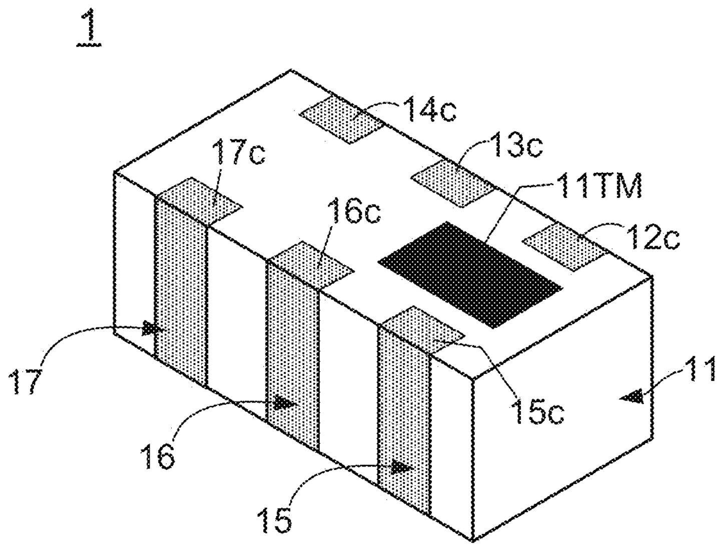
Figure 5C:
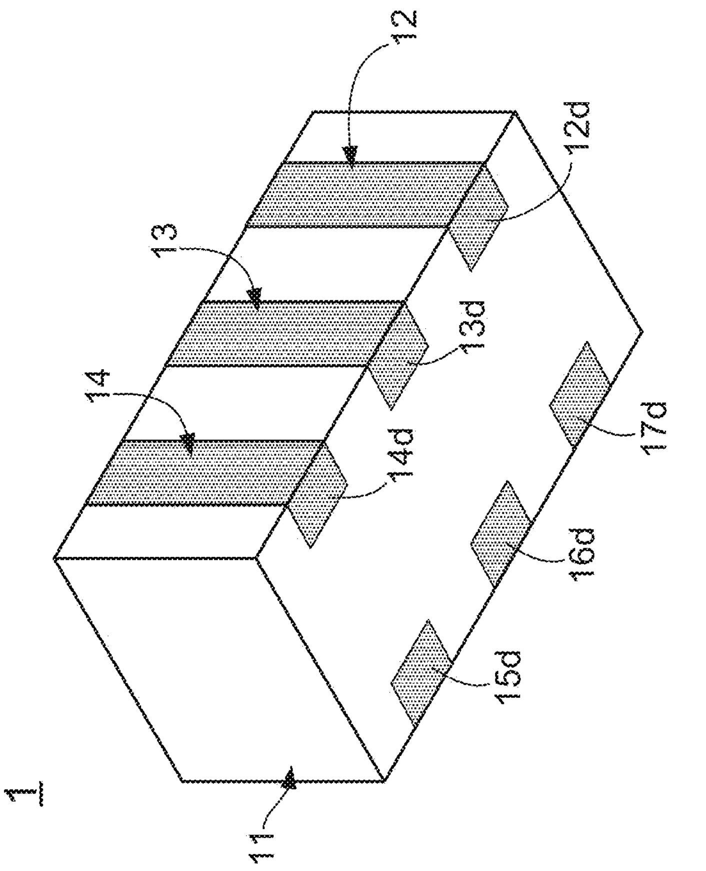
Figure 6:
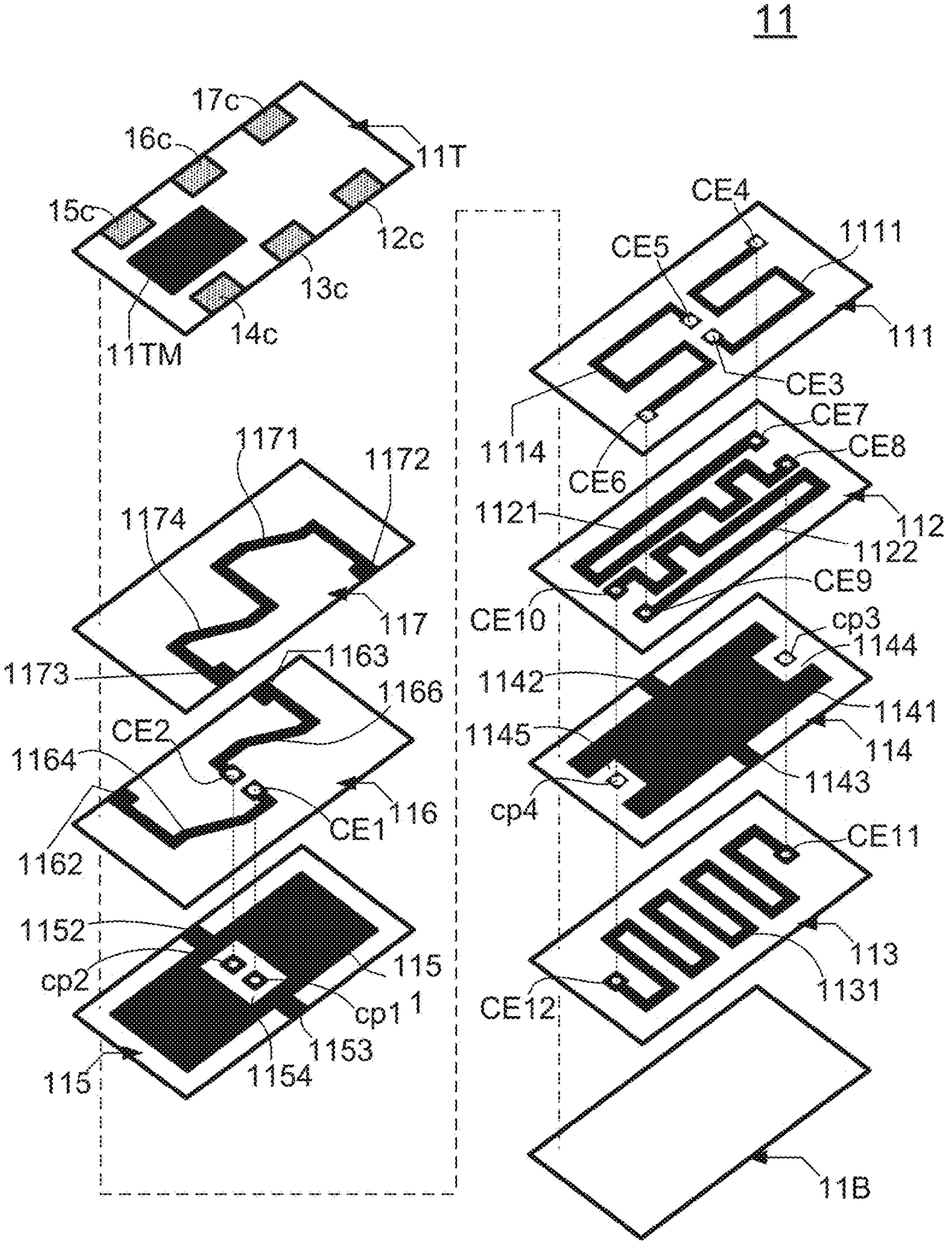
FIG. 6 shows a first exploded view of a main body of the miniature directional coupling device.

Referring to FIG. 4, FIG. 5A, FIG. 5B, and FIG. 5C again, and please simultaneously refer to FIG. 6, which illustrates a first exploded view of the main body. As the related drawings show, the main body 11 is constituted by a plurality of circuit layers stacked to each other, wherein the circuit layers comprises: a bottom substrate 11B, at least one phase retarder unit, at least one reference ground unit, a coupled circuit layer 116, a main circuit layer 117, and a top substrate 11T. As FIG. 5A, FIG. 5B, and FIG. 5C show, a first top electrode 12*c*, a second top electrode 13*c*, a third top electrode 14*c*, a fourth top electrode 15*c*, a fifth top electrode 16*c*, a sixth top electrode 17*c* are formed on the top substrate 11T, and electrically connected to the input electrode 12, the first ground electrode 13, the output electrode 14, the isolated electrode 15, the second ground electrode 16, and the coupled electrode 17, respectively. Moreover, a remark pattern 11TM is provided on the top substrate 11T.

It is worth explaining that, the main circuit layer 117 is located under the top substrate 11T, and provided with the first main line 1171 having an input terminal 1172 and the second main line 1174 having an output terminal 1173 thereon. In the present invention, the input terminal 1172 and the output terminal 1173 are respectively used as the input port DP11 and the output port DP21, and electrically connected to the input electrode 12 and the output electrode 14.

On the other hand, the coupled circuit layer 116 is located under the main circuit layer 117, and provided with the first coupled line 1166 having a coupled terminal 1163 and the second coupled line 1164 having an isolated terminal 1162 thereon. In the present invention, the coupled terminal 1163 and the isolated terminal 1162 are respectively used as the coupled port DP12 and the isolated port DP22, and electrically connected to the coupled electrode 15 and the isolated electrode 17. Moreover, the first coupled line 1166 further has a first connection terminal CE1, and the second coupled line 1164 further has a second connection terminal CE2.

Figure 2:
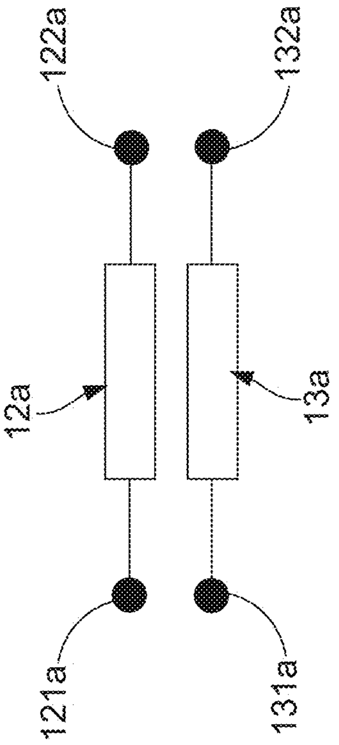
FIG. 2 (Prior Art)
FIG. 2 shows an equivalent circuit diagram of the traditional directional coupler.
Figure 3:
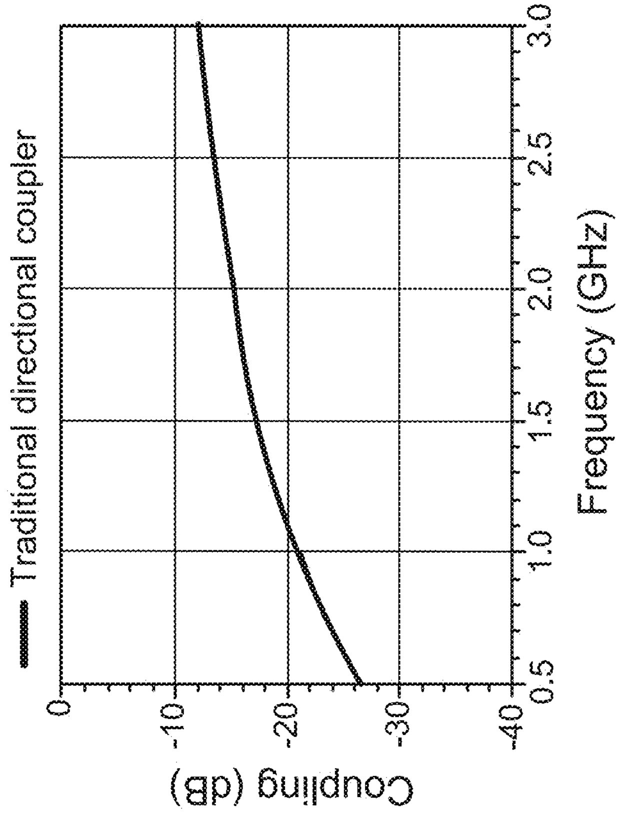
FIG. 3 (Prior Art)
FIG. 3 shows a plotted curve of frequency versus coupling.

As FIG. 2 and FIG. 4 show, the present invention particularly forms one first coupled line 1166 and a second coupled line 1164 on the coupled circuit layer 116, and connects at least one phase retarding unit between the first coupled line 1166 and the second coupled line 1164, so as to carry out the coupling modulation of the miniature directional coupling device 1 by disposing of the phase retarding unit. It is worth noting that at least one reference ground unit is also integrated in the main body 11 for making the phase retarding unit works effectively. As FIG. 6 shows, the reference ground unit comprises a first reference ground layer 115 disposed between the coupled circuit layer 116 and the phase retarding unit, and the first reference ground layer 115 comprises a first reference ground electrode 1151, a first connection portion cp1 and a second connection portion cp2. The first reference ground electrode 1151 has a first connection electrode 1152, a second connection electrode 1153 and a first non-electrode region 1154, wherein the first connection electrode 1152 and the second connection electrode 1153 are electrically connected to the first ground electrode 13 and the second ground electrode 16, respectively. Moreover, the first connection portion cp1 and the second connection portion cp2 formed on the non-electrode region 1154 for respectively connecting to the first connection terminal CE1 of the second coupled line 1164 and the second connection terminal CE2 of the first coupled line 1166.

As FIG. 6 shows, the said phase retarding unit is stacked on the bottom substrate 11B, and comprises: a first phase retarding layer 111, a second phase retarding layer 112, and a third phase retarding layer 113. The first phase retarding layer 111 is provided with a first transmission line 1111 and a second transmission line 1114 thereon, wherein the first transmission line 1111 has a third connection terminal CE3 for connecting the first connection terminal CE1 of the first coupled line 1166 and a fourth connection terminal CE4. Moreover, the second transmission line 1114 has a fifth connection terminal CE5 for connecting the second connection terminal CE2 of the second coupled line 1164 and a sixth connection terminal CE6.

Similarly, the second phase retarding layer 112 is provided with a third transmission line 1121 and a fourth transmission line 1122 thereon, wherein the third transmission line 1121 has a seventh connection terminal CE7 for connecting the fourth connection terminal CE4 of the first transmission line 1111 and an eighth connection terminal CE8. Moreover, the fourth transmission line 1122 has a ninth connection terminal CE9 for connecting the sixth connection terminal CE6 of the second transmission line 1114 and a tenth connection terminal CE10. Furthermore, the third phase retarding layer 113 is provided with a fifth transmission line 1131 thereon, wherein the fifth transmission line 1131 has a eleventh connection terminal CE11 for connecting the eighth connection terminal CE8 of the third transmission line 1121 and an twelfth CE12 for connecting the tenth connection terminal CE10 of the fourth transmission line 1122.

By the particular design and arrangement of the phase retarding unit, the first transmission line 1111 and the second transmission line 114 formed on the first phase retarding layer 111, the third transmission line 1121 and the fourth transmission line 1122 formed on the second phase retarding layer 112, and the fifth transmission line 1131 formed on the third phase retarding layer 113 does constitute the phase retarder PD as the equivalent circuit diagram of FIG. 4 shows. It needs to emphasize that, the engineers skilled in microwave engineering are able to modulate the coupling flatness and insertion loss of this miniature directional coupling device 1 by changing a total length of the first transmission line 1111, the second transmission line 1114, the third transmission line 1121, the fourth transmission line 1122, and the fifth transmission line 1131. Of course, the engineers skilled in microwave engineering can also modulate the coupling flatness and insertion loss of this miniature directional coupling device 1 by adding a fourth phase retarding layer having at least one others transmission line in to the phase retarding unit. On the other hand, the engineers skilled in microwave engineering can also modulate the coupling flatness and insertion loss of this miniature directional coupling device 1 by removing the first phase retarding layer 111, the second phase retarding layer 112 or the third phase retarding layer 113 out of the phase retarding unit.

Furthermore, for making the phase retarding works effectively, the present invention further adds a second reference ground layer 114 in the main body 11. As FIG. 6 shows, the second reference ground layer 114 is disposed between the second phase retarding layer 112 and the third phase retarding layer 113, and comprises: a second reference ground electrode 1141, a third connection portion cp3, and a fourth connection portion cp4. The second reference ground electrode 1141 has a third connection electrode 1142, a fourth connection electrode 1143, and a second non-electrode region 1144, and a third non-electrode region 1145, wherein the third connection electrode 1142 and the fourth connection electrode 1143 are electrically connected to the first ground electrode 13 and the second ground electrode 16, respectively. Moreover, the third connection portion cp3 is formed on the second non-electrode region 1144 for connecting to the ninth connection terminal CE9 of the fourth transmission line 1122 and the eleventh connection terminal CE11 of the fifth transmission line 1131. On the other hand, the fourth connection portion cp4 is formed on the third non-electrode region 1145 for connecting to the connection terminal CE10 of the fourth transmission line 1122 and the twelfth CE12 of the fifth transmission line 1131.

Figure 7:
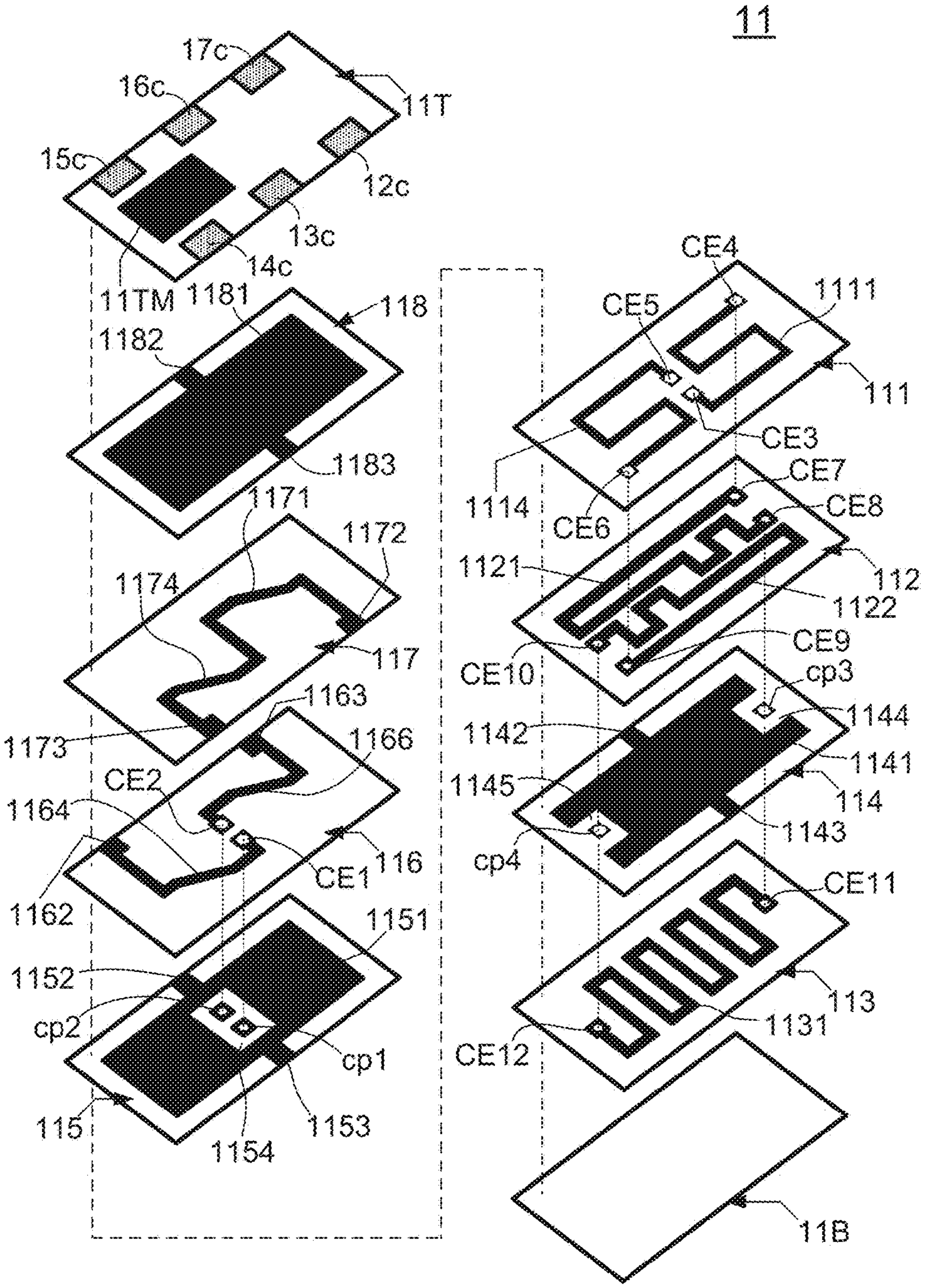
FIG. 7 shows a second exploded view of the main body.

Please further refer to FIG. 7, which shows a second exploded view of the main body. From FIG. 7, it can find that an electromagnetic shielding layer 118 is added in the main body 11 and disposed between the main circuit layer 117 and the top substrate 11T. Particularly, the electromagnetic shielding layer 118 is provided with a shielding ground electrode 1181 having a fifth connection electrode 1182 and a sixth connection electrode 1183 thereon, and the shielding ground electrode 1181 is electrically connected to the reference ground unit, the first ground electrode 13, and the second ground electrode 16. Moreover, the third connection electrode 1142 is electrically connected to the fifth connection electrode 1182 through the first ground electrode 13, and the fourth connection electrode 1143 is electrically connected to the sixth connection electrode 1183 through the second ground electrode 16.

Second Embodiment

Figure 8:
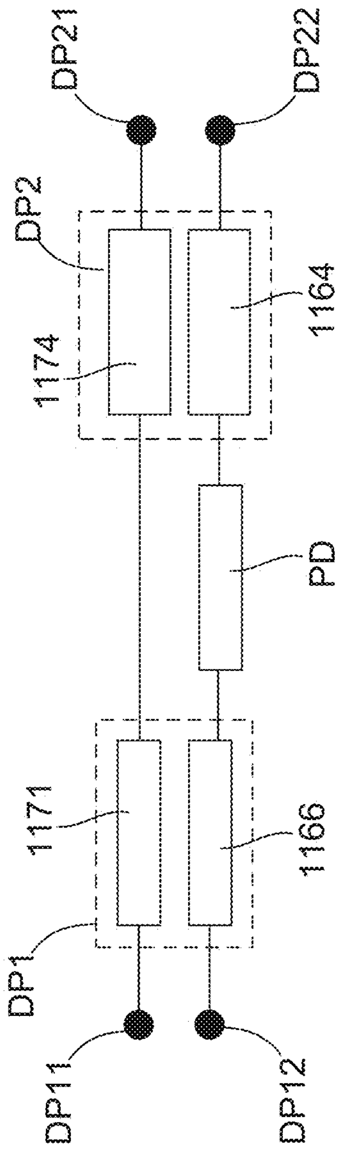
FIG. 8 shows an equivalent circuit diagram of a second embodiment of the miniature directional coupling device.
Figure 9:
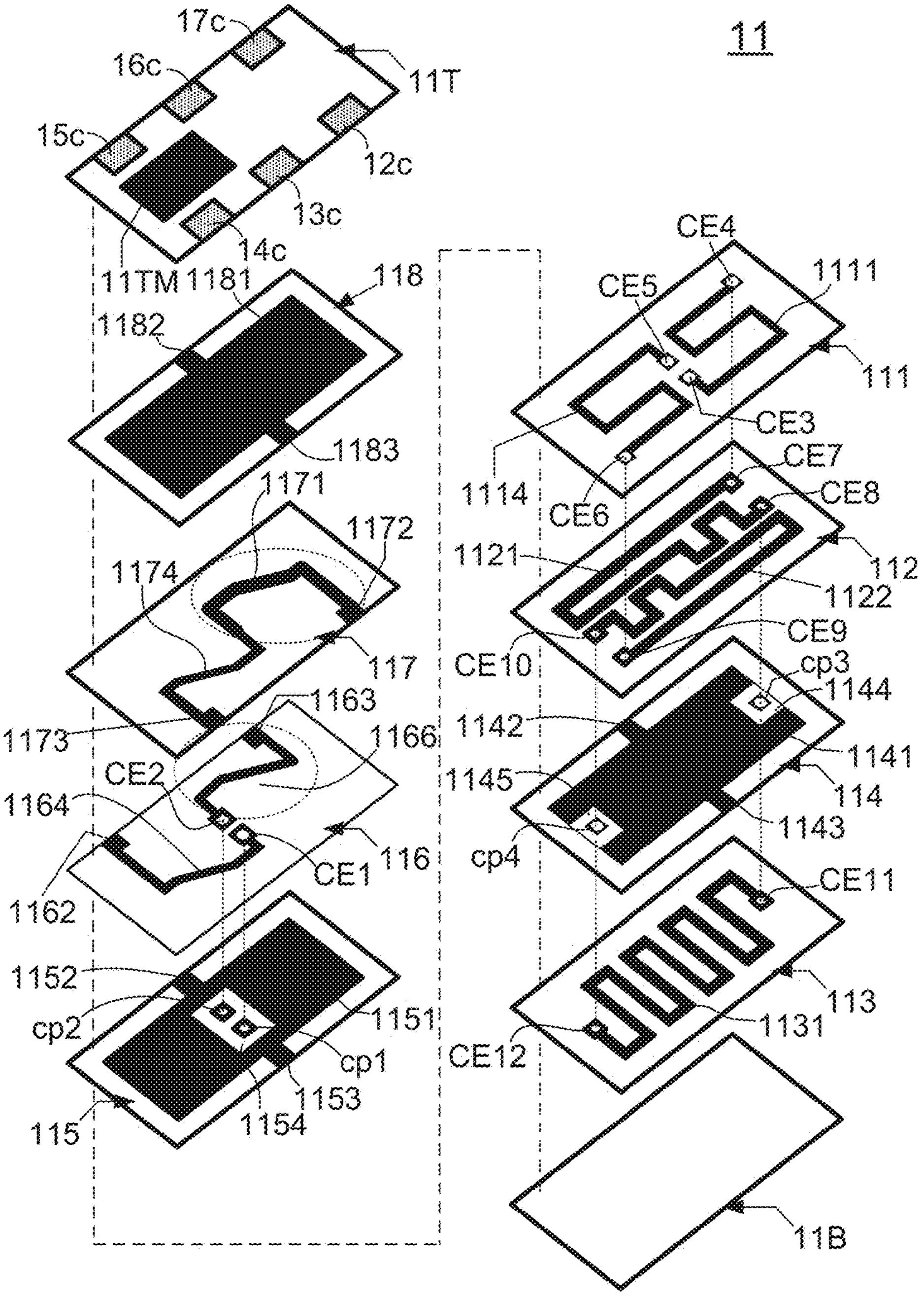
FIG. 9 shows an exploded view of the main body of the second embodiment for the miniature directional coupling device.

With reference to FIG. 8, which illustrates an equivalent circuit diagram of a second embodiment for the miniature directional coupling device. Moreover, please simultaneously refer to FIG. 9, which shows an exploded view of the main body of the miniature directional coupling device. In the second embodiment, the first directional coupler DP1 comprises a first main line 1171 and a first coupled line 1166, and has an input port DP11 and a coupled port DP12. Moreover, the second directional coupler DP2 comprises a second main line 1174 and a second coupled line 1164, and has an output port DP21 and an isolated port DP22. From FIG. 8, it can find that the first main line 1171 is connected to the second main line 1174, and the second coupled line 1164 is electrically connected to the first coupled line 1166 through a phase retarder PD. Moreover, after comparing FIG. 8 with FIG. 4, the engineers skilled in microwave engineering can find out the difference between the second embodiment and the first embodiment; that is, in the second embodiment, the width of the first main line 1171 is smaller than the width of the second main line 1174, and the width of the first coupled line 1166 is smaller than the width of the second coupled line 1164.

Figure 10:
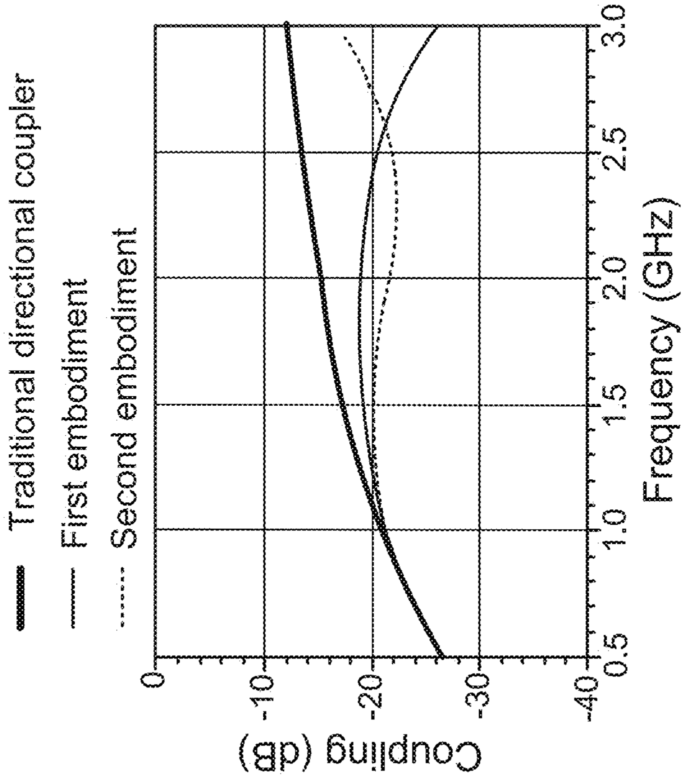
FIG. 10 shows three plotted curves of frequency versus coupling.

In the second embodiment, the second main line 1174 and the second coupled lines' 1164 width are changed in order to modulate the coupling flatness of this miniature directional coupling device 1. Please refer to FIG. 10, where three plotted curves of frequency versus coupling are provided. According to the three plotted curves, the engineers skilled in microwave engineering can calculate corresponding coupling flatness data and integrated in following Table (2). Moreover, from Table (2), the engineers skilled in microwave engineering can also find that this novel miniature directional coupling device 1 performs excellent coupling flatness after comparing to the traditional directional coupler 1*a* shown in FIG. 1 and FIG. 2.

TABLE 2

| Data curve | coupling flatness (dB) |
|---|---|
| Traditional directional coupler | 11 |
| First embodiment of the novel miniature directional coupling device | 4.9 |
| Second embodiment of the novel miniature directional coupling device | 3.3 |

Third Embodiment

Figure 11:
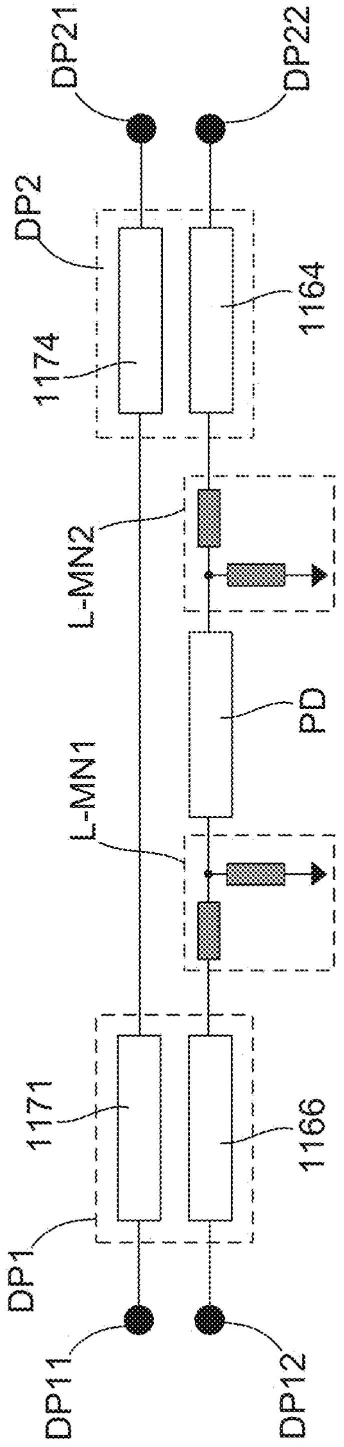
FIG. 11 shows a first equivalent circuit diagram of a third embodiment of the miniature directional coupling device.
Figure 12:
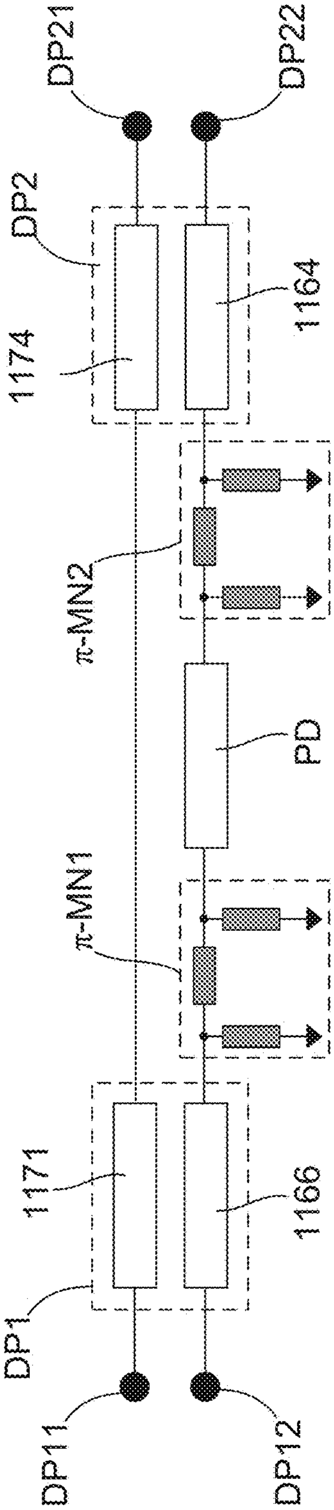
FIG. 12 shows a second equivalent circuit diagram of the third embodiment for the miniature directional coupling device.

Furthermore, a third embodiment for the miniature directional coupling device 1 continuously proposed in following paragraphs. Please refer to FIG. 11, which shows a first equivalent circuit diagram of the third embodiment for the miniature directional coupling device. As FIG. 11 shows, a first L matching network L-MN1 is disposed between the phase retarder PD and the first coupled line 1166, and a second L matching network L-MN2 is disposed between the phase retarder PD and the second coupled line 1164. Please refer to FIG. 12, which shows a second equivalent circuit diagram of the third embodiment for the miniature directional coupling device. As FIG. 12 shows, a first π matching network π-MN1 is disposed between the phase retarder PD and the first coupled line 1166, and a second π matching network π-MN2 is disposed between the phase retarder PD and the second coupled line 1164.

Fourth Embodiment

Figure 13:
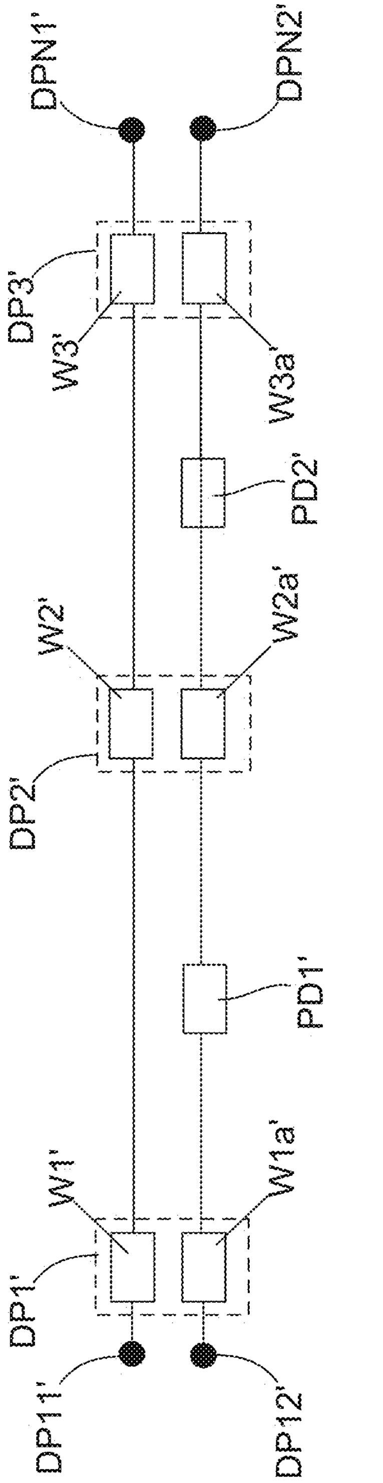
FIG. 13 shows an equivalent circuit diagram of a fourth embodiment of the miniature directional coupling device.

With reference to FIG. 13, which illustrates an equivalent circuit diagram of a fourth embodiment for the miniature directional coupling device. Moreover, please simultaneously refer to FIG. 14A, FIG. 14B and FIG. 14C, wherein stereo diagrams of the fourth embodiment are provided. As the related drawings show, the fourth embodiment of the miniature directional coupling device 1' comprises: a main body 11', an input electrode 12', a first ground electrode 13', an output electrode 14', an isolated electrode 15', a second ground electrode 16', and a coupled electrode 17'.

Figure 15:
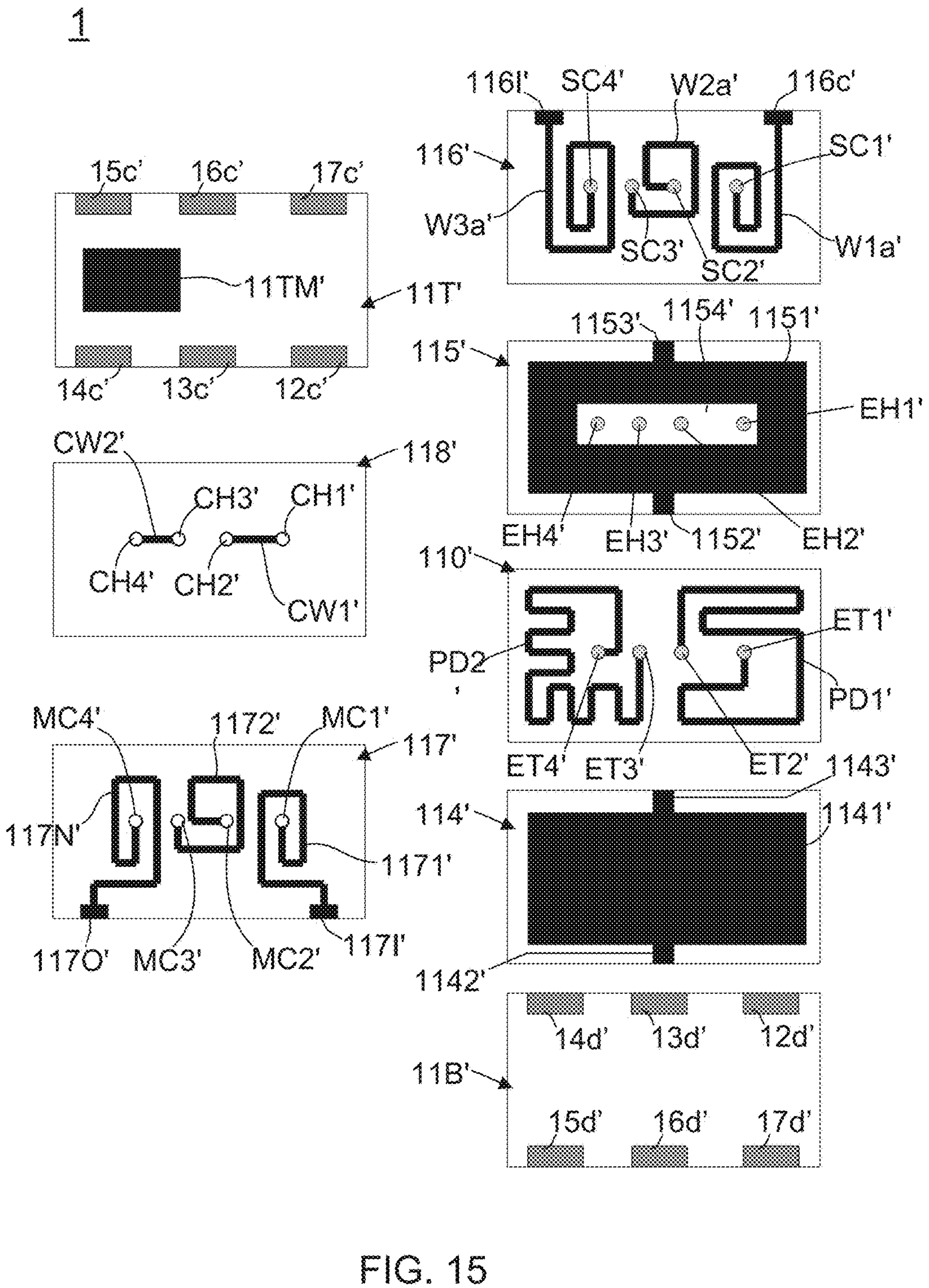
FIG. 15 shows a planar exploded view of a main body of the fourth embodiment for the miniature directional coupling device.

Please simultaneously refer to FIG. 15, which shows a planar exploded view of the main body of the fourth embodiment for the miniature directional coupling device. In the fourth embodiment, the main body 11' is provided with N number of directional couplers and N−1 number of phase retarders in the internal thereof. Particularly, each of the directional couplers are connected to each other and comprise a main line and a coupled line. Moreover, each of the phase retarders are connected between two adjacent directional couplers for making one main line of one of the two adjacent directional couplers electrically connected to the other one main line of the other directional coupler. For instance, FIG. 13 shows three directional couplers including a first directional coupler DP1' having a first main line W1' and a first coupled line W1*a*', a second directional coupler DP2' having a second main line W2' and a second coupled line W2*a*', and a third directional coupler DP3' having a third main line W3' and a s third coupled line W3*a*'. Moreover, FIG. 13 also show a first phase retarder PD1' disposed between the first coupled line W1*a*' and the second coupled line W2*a*' as well as a second phase retarder PD2' disposed between the second coupled line W2*a*' and the third coupled line W3*a*'. Herein, it needs further explain that, the first directional coupler DP1' of the N number of directional couplers having an input port DP11' and a coupled port DP12', and a N-th directional coupler (i.e., the third directional coupler DP3') of the N number of directional couplers has an output port DPN1' and an isolated port DPN2'.

In addition, the input electrode 12', the first ground electrode 13', and the output electrode 14' are formed on the first side of the main body 11', wherein the input electrode 12' and the output electrode 14' are electrically connected to the input port DP11' and the output port DPN1', respectively. On the other hand, the isolated electrode 15', the second ground electrode 16', and the coupled electrode 17' are formed on a second side of the main body 11', wherein the second side is opposite and parallel to the first side. The isolated electrode 15' and the coupled electrode 17' are electrically connected to the isolated port DPN2' and the coupled port DP12', respectively.

Figure 14A:
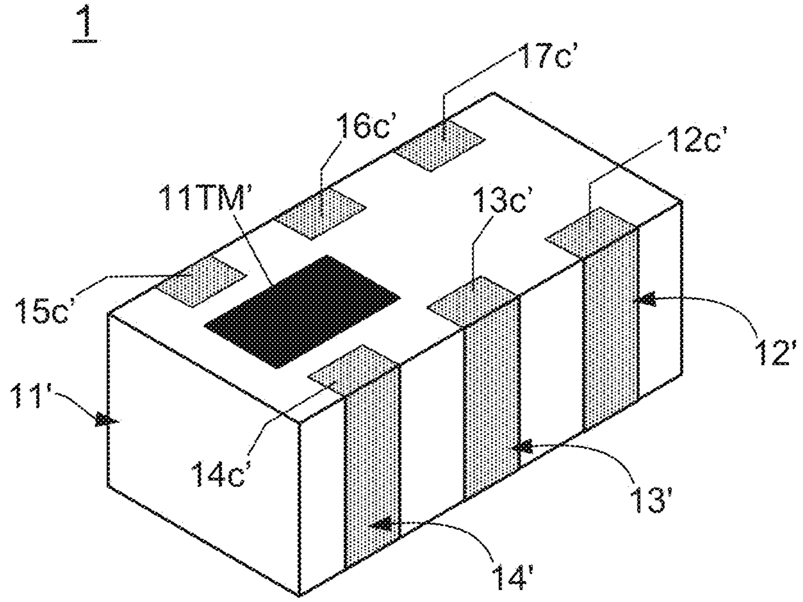
FIG. 14A, FIG. 14B and FIG. 14C show stereo diagrams of the fourth embodiment of the miniature directional coupling device.
Figure 14B:
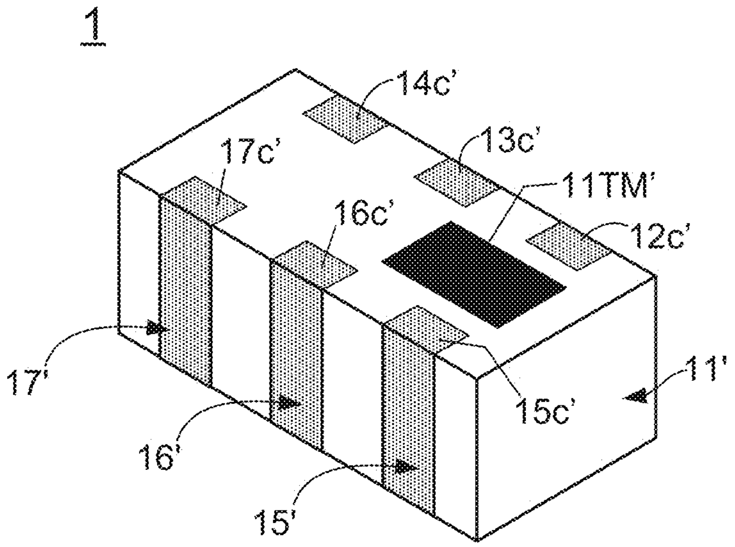
Figure 14C:
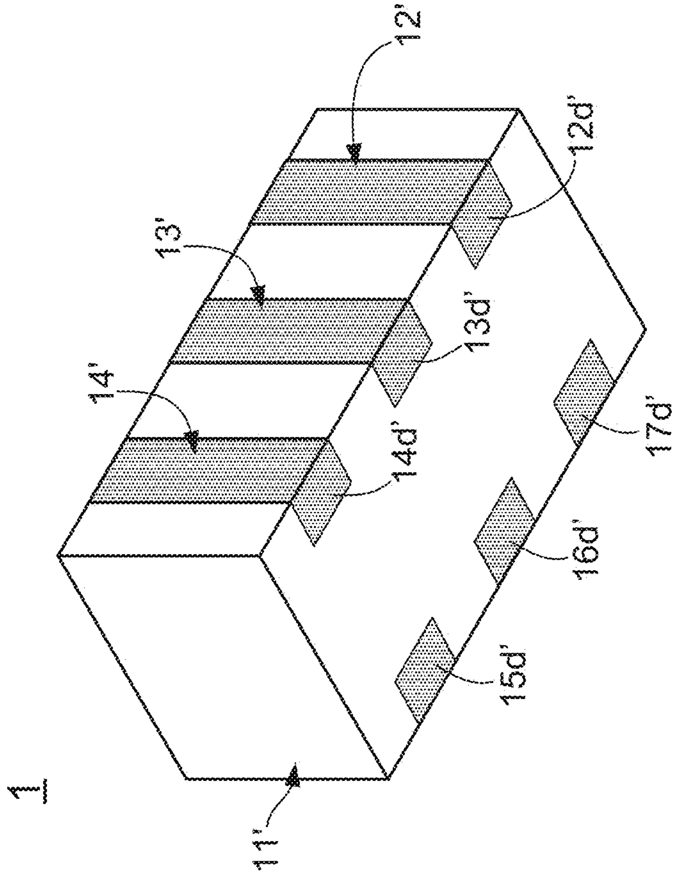

Please continuously refer to FIG. 13, FIG. 14A, FIG. 14B, FIG. 14C, and FIG. 15. In the fourth embodiment, the main body 11' is constituted by a plurality of circuit layers stacked to each other, and the circuit layers comprises: a bottom substrate 11B', a phase retarding layer 110', at least one reference ground unit, a coupled circuit layer 116', a main circuit layer 117', an intermediate layer 118', and a top substrate 11T'. As FIG. 14A, FIG. 14B and FIG. 14C show, a first top electrode 12*c*', a second top electrode 13*c*', a third top electrode 14*c*', a fourth top electrode 15*c*', a fifth top electrode 16*c*', a sixth top electrode 17*c*' are formed on the top substrate 11T', and electrically connected to the input electrode 12', the first ground electrode 13', the output electrode 14', the isolated electrode 15', the second ground electrode 16', and the coupled electrode 17', respectively. Moreover, a remark pattern 11TM' is provided on the top substrate 11T'.

Similar to the top substrate 11T', a first bottom electrode 12*d*', a second bottom electrode 13*d*', a third bottom electrode 14d', a fourth bottom electrode 15d', a fifth bottom electrode 16d', a sixth bottom electrode 17d' are formed on the bottom substrate 11B', and electrically connected to the input electrode 12', the first ground electrode 13', the output electrode 14', the isolated electrode 15', the second ground electrode 16', and the coupled electrode 17', respectively. It is worth explaining that, the phase retarding layer 110' is formed with the N−1 number of phase retarders, such as the first phase retarder PD1' and the second phase retarder PD2' represented by 2 transmission lines provided on the phase retarding layer 110'. On the other hand, the at least one reference ground unit is disposed on the retarding layer 110', and electrically connected to the first ground electrode 13' and the second ground electrode 16'.

In addition, the coupled circuit layer 116' is disposed on the reference ground unit, and provided with N number of coupled lines thereon. For instance, FIG. 15 shows a first coupled line W1a', a second coupled line W2a' and a third coupled line W3a' formed on the coupled circuit layer 116'. Particularly, a first coupled line of the N number of coupled lines has a coupled terminal 116c' connecting to the coupled electrode 17', and a N-th coupled line (i.e., the third coupled line W3a' shown in FIG. 15) of the N number of coupled lines having an isolated terminal 116I' connecting to the isolated electrode 15'. Moreover, the main circuit layer 117' is stacked on the coupled circuit layer 116, and provided with N number of main lines thereon. For instance, FIG. 15 shows a first main line W1', a main coupled line W2' and a third main line W3' formed on the main circuit layer 117'. Particularly, a first main line of the N number of main lines has an input terminal 117I' connecting to the input electrode 12', and a N-th main line (i.e., the third main line W3' shown in FIG. 15) of the N number of main lines having an output terminal 117O' connecting to the output electrode 14'. Herein, it needs to further explain that the input terminal 117I' and the output terminal 117O' are used as the input port DP11' and the output port DPN1', and the coupled terminal 116c' and the isolated terminal 116I' are used as the coupled port DP12' and the isolated port DPN2'.

The fourth embodiment of the miniature directional coupling device 1 further comprises an intermediate layer 118' disposed between the main circuit layer 117' and the top substrate 11T', wherein N−1 number of connection lines are formed on the intermediate layer 118', such as the first connection line CW1' and the second connection line CW2' shown in FIG. 15. Moreover, the N−1 number of connection lines comprise N−1 number of connection holes for making each of the connection lines electrically connected between any two main lines on the main circuit layer 117'. For instance, FIG. 15 shows a first connection hole CH1', a second connection hole CH2', a third connection hole CH3', a fourth connection hole CH4'; and accordingly, N number of main lines comprise N+1 number of connection openings for connecting the N−1 number of connection holes, such as a first connection opening a first connection opening MC1', a second connection opening MC2', a third connection opening MC3', a fourth connection opening MC4'.

As related figures show, the reference ground unit comprises a first reference ground layer 115' and a second reference ground layer 114'. The first reference ground layer 115' is disposed between the coupled circuit layer 116' and the phase retarding layer 110', and comprises: a first reference ground electrode 1151' and N+1 number of electrical connection holes. In which, the first reference ground electrode 1151' has a first connection electrode 1152', a second connection electrode 1153' and a first non-electrode region 1154', wherein the first connection electrode 1152' and the second connection electrode 1153' are electrically connected to the first ground electrode 13' and the second ground electrode 16', respectively. Moreover, the N+1 number of electrical connection holes are formed on the first non-electrode region 1154', used for making each of the phase retarders electrically connected between any two coupled lines on the coupled circuit layer 116'. For example, FIG. 15 shows a first electrical connection hole EH1', a second electrical connection hole EH2', a third electrical connection hole EH3', and a electrical connection hole EH4'. Accordingly, the N number of coupled lines comprise N+1 number of connection apertures for connecting the N+1 number of electrical connection holes, such as a first connection aperture SC1', a second connection aperture SC2', a third connection aperture SC3', and a fourth connection aperture SC4'.

On the other hand, the second reference ground layer 114' of the reference ground unit is disposed between the phase retarding layer 110' and the bottom substrate 11B', wherein a second reference ground electrode 1141' having a third connection electrode 1142' and a fourth connection electrode 1143' are provided on the second reference ground layer 114', wherein the third connection electrode 1142' and the fourth connection electrode 1143' are connected to the first ground electrode 13' and the second ground electrode 16', respectively. Moreover, it needs further explain that, N+1 number of through holes are formed on the N number of phase retarders for carry out the electrical connection between the phase retarders and the coupled lines on the coupled circuit layer 116'. The through holes are such as a first through hole ET1', a second through hole ET2', a third through hole ET3', and a fourth through hole ET4' shown in FIG. 15.

Fifth Embodiment

Figure 16:
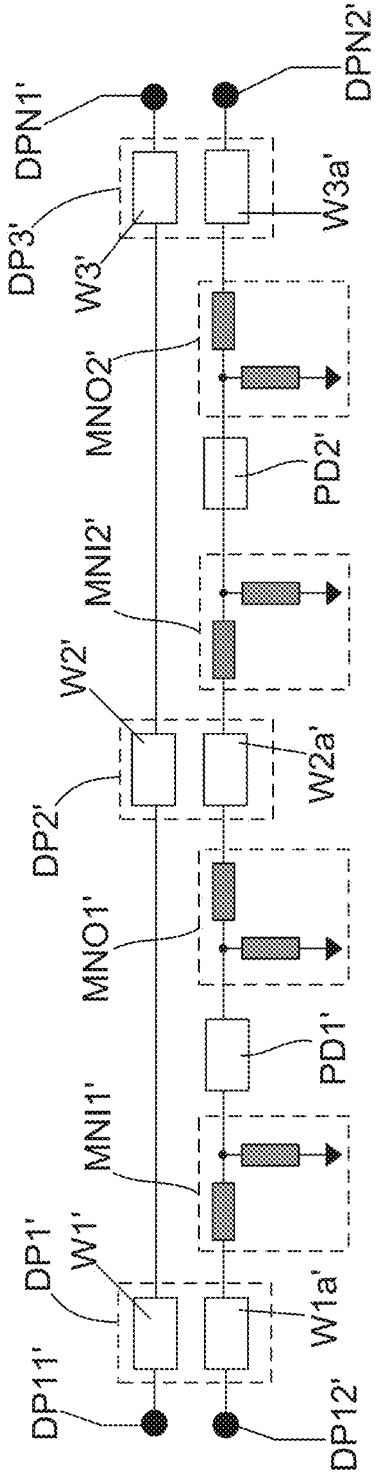
FIG. 16 shows an equivalent circuit diagram of a fifth embodiment of the miniature directional coupling device.

Furthermore, a fifth embodiment for the miniature directional coupling device 1 continuously proposed in following paragraphs. Please refer to FIG. 16, which shows an equivalent circuit diagram of the fifth embodiment for the miniature directional coupling device. As FIG. 16 shows, the miniature directional coupling device can further comprises N−1 number of matching network sets, wherein each of the matching network sets comprise an input-end matching network connecting to a signal inputting terminal of the phase retarder and an output-end matching network connecting to a signal outputting terminal of the phase retarder. For example, a first input-end matching network MNI1' is connected between the first coupled line W1a' and the first phase retarder PD1', a second input-end matching network MNI2' is connected between the second coupled line W2a' and the second phase retarder PD2', a first output-end matching network MNO1' is connected between the first phase retarder PD1' and the second coupled line W2a', and a second output-end matching network MNO2' is connected between the second phase retarder PD2' and the third coupled line W3a'. It is worth explaining that, both the input-end matching network and the output-end matching network are selected from the group consisting of: π matching network and L matching network.

Figure 1:
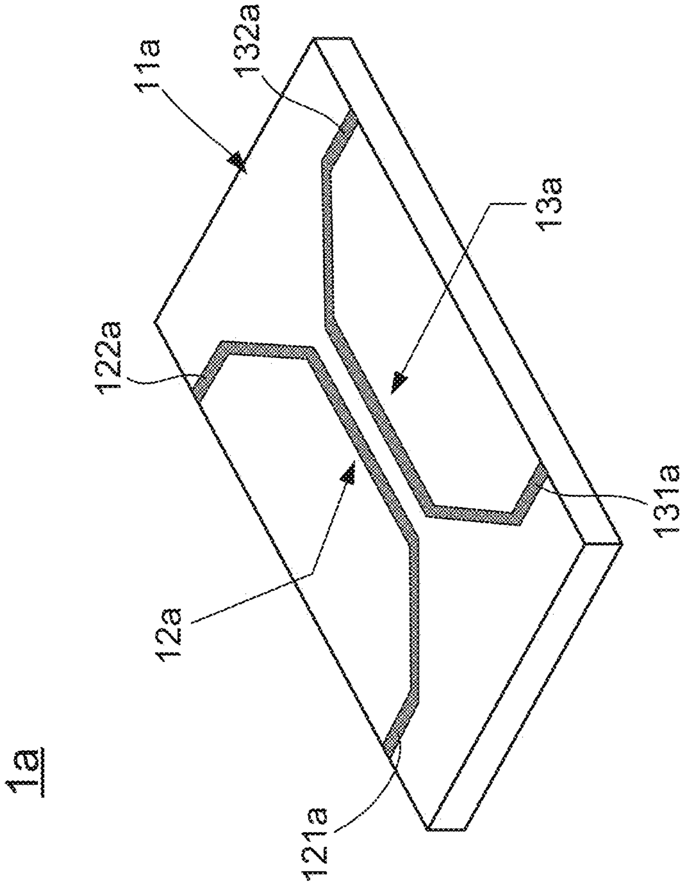
FIG. 1 (Prior Art)
FIG. 1 shows a stereo view of a traditional directional coupler.

Therefore, through above descriptions, the novel miniature directional coupling device provided by the present invention has been introduced completely and clearly; in summary, the present invention includes the advantages of:

(1) Differing from conventional directional coupling device (as FIG. 1 shows) being implemented on a coin-like planar board, the present invention stacks a bottom substrate 11B, at least one phase retarding unit, at least one reference ground unit, a coupled circuit layer 116, a main circuit layer 117, and a top substrate 11T to form a miniature directional coupling device 1. Because this miniature directional coupling device 1 not occupies too much circuit area when being applied in a mobile communication product, the miniature directional coupling device can meet the requirements of light weight and compact size demanded by high-technology mobile communications for the electronic components.

(2) It is worth explaining that, since the said phase retarding unit consists of many end-to-end connected transmission wires, engineers skilled in designing microwave circuit are able to carry out the modulation of coupling flatness of the miniature directional coupling device by changing a total length of the end-to-end connected transmission wires.

The above description is made on embodiments of the present invention. However, the embodiments are not intended to limit scope of the present invention, and all equivalent implementations or alterations within the spirit of the present invention still fall within the scope of the present invention.

What is claimed is:

1. A miniature directional coupling device, comprising:
- a main body, comprising:
  - a first directional coupler, comprising a first main line, a first coupled line, an input port, and a coupled port;
  - a second directional coupler, comprising a second main line connected to the first main line, a second coupled line, an output port, and an isolated port; and
  - at least one phase retarder, being connected between the second coupled line and the first coupled line;
- an input electrode, being formed on a first side of the main body, and electrically connected to the input port;
- a first ground electrode, being formed on the first side of the main body;
- an output electrode, being formed on the first side of the main body, and electrically connected to the output port;
- an isolated electrode, being formed on a second side of the main body, and electrically connected to the isolated port; wherein the second side is opposite and parallel to the first side;
- a second ground electrode, being formed on the second side of the main body; and
- a coupled electrode, being formed on the second side of the main body, and electrically connected to the coupled port.

2. The miniature directional coupling device of claim 1, wherein the main body is constituted by a plurality of circuit layers stacked to each other, and the circuit layers comprises:
- a bottom substrate;
- at least one phase retarder unit, being stacked on the bottom substrate, so as to form the at least one phase retarder;
- at least one reference ground unit, being disposed on the phase retarding unit, and electrically connected to the first ground electrode and the second ground electrode;
- a coupled circuit layer, being stacked on the reference ground unit, and provided with the first coupled line having a coupled terminal and the second coupled line having an isolated terminal thereon;
- a main circuit layer, being stacked on the coupled circuit layer, and provided with the first main line having an input terminal and the second main line having an output terminal thereon; and
- a top substrate, being stacked on the main circuit layer;
- wherein the input terminal and the output terminal are used as the input port of the first directional coupler and the output port of the second directional coupler;
  - moreover, the coupled terminal and the isolated terminal being used as the coupled port of the first directional coupler and the isolated port of the second directional coupler.

3. The miniature directional coupling device of claim 2, further comprising an electromagnetic shielding layer disposed between the main circuit layer and the top substrate; wherein a shielding ground electrode is provided on the electromagnetic shielding layer, and electrically connected to the reference ground unit, the first ground electrode, and the second ground electrode.

4. The miniature directional coupling device of claim 2, wherein a first top electrode, a second top electrode, a third top electrode, a fourth top electrode, a fifth top electrode, a sixth top electrode are formed on the top substrate, and electrically connected to the input electrode, the first ground electrode, the output electrode, the isolated electrode, the second ground electrode, and the coupled electrode, respectively.

5. The miniature directional coupling device of claim 2, wherein a remark pattern is provided on the top substrate.

6. The miniature directional coupling device of claim 2, wherein a first bottom electrode, a second bottom electrode, a third bottom electrode, a fourth bottom electrode, a fifth bottom electrode, a sixth bottom electrode are formed on the bottom substrate, and electrically connected to the input electrode, the first ground electrode, the output electrode, the isolated electrode, the second ground electrode, and the coupled electrode, respectively.

7. The miniature directional coupling device of claim 2, wherein the width of the first main line is equal to the width of the second main line, and the width of the first coupled line being equal to the width of the second coupled line.

8. The miniature directional coupling device of claim 2, wherein the width of the first main line is smaller than the width of the second main line, and the width of the first coupled line being smaller than the width of the second coupled line.

9. The miniature directional coupling device of claim 2, wherein the width of the first main line is greater than the width of the second main line, and the width of the first coupled line being greater than the width of the second coupled line.

10. The miniature directional coupling device of claim 2, wherein the first coupled line further has a first connection terminal, and the second coupled line further having a second connection terminal.

11. The miniature directional coupling device of claim 2, further comprising:
- a first matching network, being coupled between the phase retarder and the first coupled line; and
- a second matching network, being coupled between the phase retarder and the second coupled line.

12. The miniature directional coupling device of claim 10, wherein the reference ground unit comprises a first reference ground layer disposed between the coupled circuit layer and the phase retarding unit, and the first reference ground layer comprising:
- a first reference ground electrode, having a first connection electrode, a second connection electrode and a first non-electrode region, wherein the first connection electrode and the second connection electrode are electrically connected to the first ground electrode and the second ground electrode, respectively;

a first connection portion, being formed on the first non-electrode region for connecting to the first connection terminal of the second coupled line; and a second connection portion, being formed on the non-electrode region for connecting to the second connection terminal of the first coupled line.

13. The miniature directional coupling device of claim 11, wherein both the first matching network and the second matching network are selected from the group consisting of: π matching network and L matching network.

14. The miniature directional coupling device of claim 12, wherein the phase retarding unit comprises:

a first phase retarding layer, comprising:

a first transmission line, having a third connection terminal for connecting the first connection terminal of the first coupled line and a fourth connection terminal; and a second transmission line, having a fifth connection terminal for connecting the second connection terminal of the second coupled line and a sixth connection terminal;

a second phase retarding layer, comprising:

a third transmission line, having a seventh connection terminal for connecting the fourth connection terminal of the first transmission line and an eighth connection terminal; and a fourth transmission line, having a ninth connection terminal for connecting the sixth connection terminal of the second transmission line and a tenth connection terminal; and a third phase retarding layer, comprising:

a fifth transmission line, having a eleventh connection terminal for connecting the eighth connection terminal of the third transmission line and an twelfth for connecting the tenth connection terminal of the fourth transmission line.

15. The miniature directional coupling device of claim 14, wherein the reference ground unit further comprises a second reference ground layer disposed between the second phase retarding layer and the third phase retarding layer, and the second reference ground layer comprising:

a second reference ground electrode, having a third connection electrode, a fourth connection electrode, and a second non-electrode region, and a third non-electrode region, wherein the third connection electrode and the fourth connection electrode are electrically connected to the first ground electrode and the second ground electrode, respectively;

a third connection portion, being formed on the second non-electrode region for connecting to the ninth connection terminal of the fourth transmission line and the eleventh connection terminal of the fifth transmission line; and a fourth connection portion, being formed on the third non-electrode region for connecting to the connection terminal of the fourth transmission line and the twelfth of the fifth transmission line.

16. A miniature directional coupling device, comprising:

a main body, comprising:

N number of directional couplers, wherein each of the directional couplers are connected to each other and comprise a main line and a coupled line; moreover, a first directional coupler of the N number of directional couplers having an input port and a coupled port, and a N-th directional coupler of the N number of directional couplers having an output port and an isolated port; and N−1 number of phase retarders, wherein each of the phase retarders are connected between two adjacent directional couplers for making one main line of one of the two adjacent directional couplers electrically connected to the other one main line of the other directional coupler;

an input electrode, being formed on a first side of the main body, and electrically connected to the input port;

a first ground electrode, being formed on the first side of the main body;

an output electrode, being formed on the first side of the main body, and electrically connected to the output port;

an isolated electrode, being formed on a second side of the main body, and electrically connected to the isolated port; wherein the second side is opposite and parallel to the first side;

a second ground electrode, being formed on the second side of the main body; and a coupled electrode, being formed on the second side of the main body, and electrically connected to the coupled port.

17. The miniature directional coupling device of claim 16, wherein the main body is constituted by a plurality of circuit layers stacked to each other, and the circuit layers comprises:

a bottom substrate;

a phase retarding layer, being stacked on the bottom substrate, and provided with the N−1 number of phase retarders thereon;

at least one reference ground unit, being disposed on the phase retarding layer, and electrically connected to the first ground electrode and the second ground electrode;

a coupled circuit layer, being stacked on the reference ground unit, and provided with N number of coupled lines thereon; wherein a first coupled line of the N number of coupled lines has a coupled terminal connecting to the coupled electrode, and a N-th coupled line of the N number of coupled lines having an isolated terminal connecting to the isolated electrode;

a main circuit layer, being stacked on the coupled circuit layer, and provided with N number of main lines thereon; wherein a first main line of the N number of main lines has an input terminal connecting to the input electrode, and a N-th main line of the N number of main lines having an output terminal connecting to the output electrode; and a top substrate, being stacked on the main circuit layer;

wherein the input terminal and the output terminal are used as the input port and the output port, and the coupled terminal and the isolated terminal being used as the coupled port and the isolated port.

18. The miniature directional coupling device of claim 17, wherein the N number of main lines comprise N+1 number of connection openings, and the N number of coupled lines comprising N+1 number of second connection apertures.

19. The miniature directional coupling device of claim 18, further comprising an intermediate layer disposed between the main circuit layer and the top substrate, and N−1 number of connection lines being formed on the intermediate layer; wherein the N−1 number of connection lines comprise N−1 number of connection holes for making each of the connection lines electrically connected between any two main lines on the main circuit layer.

20. The miniature directional coupling device of claim 18, wherein a first top electrode, a second top electrode, a third top electrode, a fourth top electrode, a fifth top electrode, a sixth top electrode are formed on the top substrate, and electrically connected to the input electrode, the first ground electrode, the output electrode, the isolated electrode, the second ground electrode, and the coupled electrode, respectively.

21. The miniature directional coupling device of claim 18, wherein a remark pattern is provided on the top substrate.

22. The miniature directional coupling device of claim 18, wherein a first bottom electrode, a second bottom electrode, a third bottom electrode, a fourth bottom electrode, a fifth bottom electrode, a sixth bottom electrode are formed on the bottom substrate, and electrically connected to the input electrode, the first ground electrode, the output electrode, the isolated electrode, the second ground electrode, and the coupled electrode, respectively.

23. The miniature directional coupling device of claim 18, wherein the reference ground unit comprises a first reference ground layer disposed between the coupled circuit layer and the phase retarding layer, and the first reference ground layer comprising:

a first reference ground electrode, having a first connection electrode, a second connection electrode and a first non-electrode region, wherein the first connection electrode and the second connection electrode are electrically connected to the first ground electrode and the second ground electrode, respectively;

N+1 number of electrical connection holes, being formed on the first non-electrode region, used for making each of the phase retarders electrically connected between any two coupled lines on the coupled circuit layer.

24. The miniature directional coupling device of claim 23, wherein the reference ground unit further comprises a second reference ground layer disposed between the phase retarding layer and the bottom substrate; wherein a second reference ground electrode having a third connection electrode and a fourth connection electrode are provided on the second reference ground layer; moreover, the third connection electrode and the fourth connection electrode being connected to the first ground electrode and the second ground electrode, respectively.

25. The miniature directional coupling device of claim 23, wherein the N number of phase retarders are a plurality of transmission lines formed on the phase retarding layer.

26. The miniature directional coupling device of claim 23, further comprising N−1 number of matching network sets, wherein each of the matching network sets comprise an input-end matching network connecting to a signal inputting terminal of the phase retarder and an output-end matching network connecting to a signal outputting terminal of the phase retarder.

27. The miniature directional coupling device of claim 26, wherein both the input-end matching network and the output-end matching network are selected from the group consisting of: π matching network and L matching network.

* * * * *